(12) United States Patent
Ryu et al.

(10) Patent No.: US 7,626,329 B2
(45) Date of Patent: Dec. 1, 2009

(54) ORGANIC ELECTROLUMINESCENT DEVICE WITH BLACK INSULATOR

(75) Inventors: Byung Gil Ryu, Seoul (KR); Kyung Ku Kim, Seoul (KR); Hong Rae Cha, Seoul (KR); Myeong Soo Chang, Uiwang-si (KR); Young Soo Han, Seoul (KR); Hwa Kyung Kim, Seoul (KR); Jae Woo Kyung, Seoul (KR); Hong Seok Choi, Seoul (KR); Myung Jong Jung, Seoul (KR); Chang Nam Kim, Jungong-gu (KR)

(73) Assignee: LG Display Co., Ltd, Seoul (KR)

( * ) Notice: Subject to any disclaimer, the term of this patent is extended or adjusted under 35 U.S.C. 154(b) by 359 days.

(21) Appl. No.: 11/037,225

(22) Filed: Jan. 19, 2005

(65) Prior Publication Data
US 2005/0179368 A1 Aug. 18, 2005

(30) Foreign Application Priority Data
Jan. 20, 2004 (KR) .................. 10-2004-0004461
Sep. 9, 2004 (KR) .................. 10-2004-0072116

(51) Int. Cl.
H05B 33/04 (2006.01)
H05B 33/10 (2006.01)

(52) U.S. Cl. ...................... 313/504; 313/506
(58) Field of Classification Search ......... 313/504–506, 313/503; 315/169.1, 169.3, 169.4
See application file for complete search history.

(56) References Cited

U.S. PATENT DOCUMENTS

| | | | |
|---|---|---|---|
| 6,184,521 B1* | 2/2001 | Coffin et al. ............ 250/237 R |
| 6,344,712 B1* | 2/2002 | Eida et al. .................. 313/504 |
| 6,515,428 B1* | 2/2003 | Yeh et al. ................. 315/169.3 |
| 6,633,121 B2* | 10/2003 | Eida et al. ................... 313/504 |
| 6,653,779 B1* | 11/2003 | Lu ............................... 313/505 |
| 6,791,262 B2* | 9/2004 | Bachmann et al. .......... 313/506 |
| 6,872,766 B2* | 3/2005 | Schunk et al. .............. 524/357 |
| 7,230,594 B2* | 6/2007 | Miller et al. .................. 345/82 |
| 7,298,443 B2* | 11/2007 | Masuda et al. ............. 349/117 |
| 2002/0008467 A1 | 1/2002 | Nagayama et al. .......... 313/506 |
| 2002/0050958 A1 | 5/2002 | Matthies et al. .............. 345/55 |
| 2003/0011306 A1* | 1/2003 | Bechtel et al. .............. 313/509 |

(Continued)

FOREIGN PATENT DOCUMENTS

EP    1 191 823 A1    3/2003

(Continued)

OTHER PUBLICATIONS

European Search Report dated Aug. 30, 2006.

*Primary Examiner*—Sikha Roy
*Assistant Examiner*—Anne M Hines
(74) *Attorney, Agent, or Firm*—Morgan Lewis & Bockius LLP

(57) ABSTRACT

An improved organic electroluminescent device is provided. The device may include a protection layer provided on non-light-emitting regions of a panel to prevent reflection of external light. The protection layer may include an optical filter used in combination with a black insulator. The protection layer may provide for improved reflectance and transmissivity, and improved brightness without a commensurate reduction in contrast.

5 Claims, 10 Drawing Sheets

U.S. PATENT DOCUMENTS

| | | |
|---|---|---|
| 2003/0077437 A1* | 4/2003 | Nakamura et al. .......... 428/327 |
| 2003/0122140 A1 | 7/2003 | Yamazaki et al. ............ 257/88 |
| 2003/0146695 A1 | 8/2003 | Seki ........................... 313/506 |
| 2003/0155860 A1 | 8/2003 | Choi et al. .................. 313/498 |
| 2003/0201445 A1 | 10/2003 | Park et al. ..................... 257/79 |
| 2003/0203551 A1* | 10/2003 | Cok et al. ................... 438/200 |
| 2003/0230972 A1* | 12/2003 | Cok ............................ 313/504 |
| 2004/0000863 A1 | 1/2004 | Miyake ...................... 313/501 |

FOREIGN PATENT DOCUMENTS

| | | |
|---|---|---|
| EP | 1 351 323 A2 | 10/2003 |
| EP | 1351323 A2 * | 10/2003 |

* cited by examiner

Light

ORGANIC ELECTROLUMINESCENT DEVICE WITH BLACK INSULATOR

This Nonprofessional application claims priority under 35 U.S.C. § 119(a) on Patent Application No. 10-2004-0004461 filed in Korea on Jan. 20, 2004, and Patent Application No. 10-2004-0072116 filed in Korea on Sep. 9, 2004, the entire contents of which are hereby incorporated by reference.

BACKGROUND OF THE INVENTION

1. Field of the Invention

The present invention relates to a display device, and more particularly, to an organic electroluminescent (EL) device and a method of manufacturing the same, wherein the picture quality of an organic electroluminescent display (OELD) can be improved.

2. Description of the Background Art

Recently, as the size of display devices increases, there is an increasing need for flat panel display devices that occupy a smaller area. Electroluminescent (EL) devices have come into the spotlight as one of these flat panel display devices.

The electroluminescent devices can be mainly classified into inorganic electroluminescent devices and organic electroluminescent devices depending on the type of materials used.

The inorganic electroluminescent devices are adapted to emit light in such a manner that a high electric field is applied to a light-emitting unit, and electrons are accelerated within the high electric field in such a way to collide toward the center of emission, thereby exciting the center of emission.

Further, the organic electroluminescent devices are adapted to emit light when exciton, which is generated through combination of electrons and holes that are injected from an electron injection node (cathode) and a hole injection node (anode) into the light-emitting unit, falls from an excited state to a ground state.

The inorganic electroluminescent devices with the above-described operating principle require a high electric field. Thus, a high voltage of 100 to 200V is required as a driving voltage. On the contrary, the organic electroluminescent devices are advantageous in that they can be driven at a low voltage of about 5 to 20V. Thus, research on the organic electroluminescent devices has been actively performed.

In addition, the organic electroluminescent devices have excellent characteristics such as a wide viewing angle, high response rates and high contrast, and they can be thus used for graphic display pixels, pixels of a television image display surface light source and so on. Also, the organic electroluminescent devices are suitable for a next-generation flat panel display device since they are light and have a good color sense.

The organic electroluminescent devices are usually called organic electroluminescent devices. This will be below described in more detail.

Organic EL refers to a display mode in which characters, images, etc. are displayed using an organic luminescent device that emits light by itself if being applied with current. In the concrete, organic EL refers to a condition in which light is generated through a process where electrons and holes form electron and hole pairs within semiconductors, or carriers are excited to a higher energy state and are then stabilized.

The response speed of the organic electroluminescent device is ten thousand times faster than that of thin film transistor liquid crystal display (TFT-LCD) devices. Thus, the organic electroluminescent device has an advantage in that it can produce a relatively stable motion picture without blurring. Also, the material of the organic electroluminescent device, which constitutes the screen, is able to emit light by itself. Thus, the organic electroluminescent device does not require a backlight as in LCD product groups. Accordingly, the organic electroluminescent device has advantages in that the life span of a battery can be increased since less power is needed, and a thickness of the panel can be reduced commensurate with the thickness of a backlight which would otherwise have to be used. The organic EL display panel is disadvantageous in implementing a large-size screen, but is advantageous in resolution, power consumption, etc., compared with a PDP.

The organic electroluminescent device has been consistently improved in terms of technology. It is thus expected that the organic electroluminescent device will be in its place as next-generation display devices.

The organic EL display can be classified into a passive matrix (PM) type and an active matrix (AM) type depending on its driving mode.

The PM type is a structure in which a driving circuit is provided outside an organic EL panel to light-emit an organic electroluminescent device. This type is advantageous in that the structure of the panel is simple and the cost is low because the driving circuit is located outside the panel. However, this PM type has problems in that the current flowing through respective pixels must be the same so as to make uniform the brightness of the whole pixel, and power consumption is significantly greater since the charge/discharge current applied to a capacitive load is high.

Meanwhile, the AM type is a structure in which a driving circuit such as TFT is provided in each pixel. Thus, this AM type has advantages in that power consumption is low and deviation in the brightness is small, compared with the PM type.

Meanwhile, the organic EL panel has reflectance of over 80%, which results in degraded contrast.

Further, since the cathode of a device is usually made of a metal having good reflectance, external light, which is incident to the device, is reflected from the surface of the cathode, and is then mixed with light generated from a light-emitting layer.

In order to solve this problem, a circular polarizing filter is formed at the bottom of a transparent substrate in most organic electroluminescent devices, thus reducing the reflection of the externally incident light from the cathode.

FIG. 1 is a cross-sectional view illustrating the construction of a conventional organic electroluminescent (EL) device.

The conventional organic electroluminescent device includes a transparent anode 102 formed on a transparent substrate 101, an organic EL layer 103 having a hole injection layer (HIL), a hole transport layer (HTL), an emitting layer (EML), an electron transport layer (ETL) and an electron injection layer (EIL), the organic EL layer 103 being coated on the transparent anode 102 through a vacuum deposition method, and a metal cathode 104 of good reflectance, which is formed on the organic-EL layer 103.

In this structure, however, if outer atmosphere is bright, external light that is incident on the device is reflected by the metal electrode 104, and is then mixed with light that is generated from the emitting layer of the organic EL layer 103. Accordingly, contrast is significantly lowered.

In order to solve this problem, in the prior art, a circular polarizing filter 105 is disposed in front of the organic electroluminescent device so as to reduce the reflection of external light. That is, when external light is incident, half of the light is blocked by the circular polarizing filter 105 and the remaining half of the light is blocked when being reflected back from the cathode 104. It is thus possible to prohibit the lowering of contrast due to the external light.

Accordingly, a filter 105 for lowering reflectance and improving contrast is formed in front of the panel. The filter usually includes a circular polarizer (hereinafter, referred to as "circular polarizing filter").

FIG. 2 is a conceptual view for explaining the structure of a conventional circular polarizing filter and the principle of blocking external light using such a filter.

A circular polarizing filter 210 has a structure in which a linear polarizer 201 and a λ/4 retarder 205 are overlapped. Natural external light is transformed into light that vibrates in a given direction while passing through the linear polarizer 201 of the circular polarizing filter 210. The light is then transformed into light that rotates in a spiral form while passing through the λ/4 retarder 205. In more detail, the λ/4 retarder 205 uses birefringence crystals. When light of a given wavelength, which is vertically incident to an incident surface, transmits the crystals, the λ/4 retarder 205 makes the light have a phase difference of 90 degrees. Since light reflected from the front of the panel is redirected through the circular polarizing filter 210 having this characteristic, reflectance can be lowered by approximately 30 to 50%.

The circular polarizing filter is effective in reducing the reflectance by some degree. However, the circular polarizing filter has an adverse effect of lowering transmissivity, and has a disadvantage in that the cost is high. Furthermore, the reduction in transmissivity results in lowered luminous efficiency of the organic EL display panel.

SUMMARY OF THE INVENTION

The object of the present invention is to solve at least the problems and disadvantages of the background art.

Accordingly, the present invention has been made in view of the above problems occurring in the prior art, and it is an object of the present invention to provide an organic EL filter in which the overall transmissivity of a panel is increased, but reflectance of the panel is lowered, thereby improving luminous efficiency of the panel.

Another object of the present invention is to provide an organic electroluminescent device in which a black insulator and an optical filter are used to improve contrast and the color sense of the organic electroluminescent device, thus improving the display picture quality.

To achieve the above objects, according to an embodiment of the present invention, there is provided an organic electroluminescent device, wherein the remaining regions other than the light-emitting regions of a front surface of a panel include a filter on which black matrices for preventing reflection of external light are coated.

According to another embodiment of the present invention, there is provided an organic electroluminescent device of various modes, which includes a plurality of pixels each composed of a first electrode, an organic electroluminescent layer and a second electrode, including a black insulator formed on the entire regions other than the pixels, for reducing reflection of externally incident light and providing insulating among the pixels, and an optical filter formed in a direction in which light generated from the electroluminescent layer is outputted toward the outside.

According to still another embodiment of the present invention, there is provided a method of manufacturing an organic electroluminescent device, including the steps of forming a plurality of first electrodes with a given distance therebetween on a transparent substrate, forming a black insulating film on the entire surface other than light-emitting regions of the first electrodes, forming barrier ribs on the black insulating film between the light-emitting regions in a direction vertical to the first electrodes, sequentially forming an organic electroluminescent layer and a second electrode on the entire surface including the barrier ribs, and forming an optical filter in a direction in which light generated from the organic electroluminescent layer is outputted toward the outside.

The present invention has effects in that it can significantly improve the brightness without significant reduction in contrast and can improve the picture quality of an organic EL device.

BRIEF DESCRIPTION OF THE DRAWINGS

The invention will be described in detail with reference to the following drawings in which like numerals refer to like elements.

DETAILED DESCRIPTION OF PREFERRED EMBODIMENTS

Figure 1:
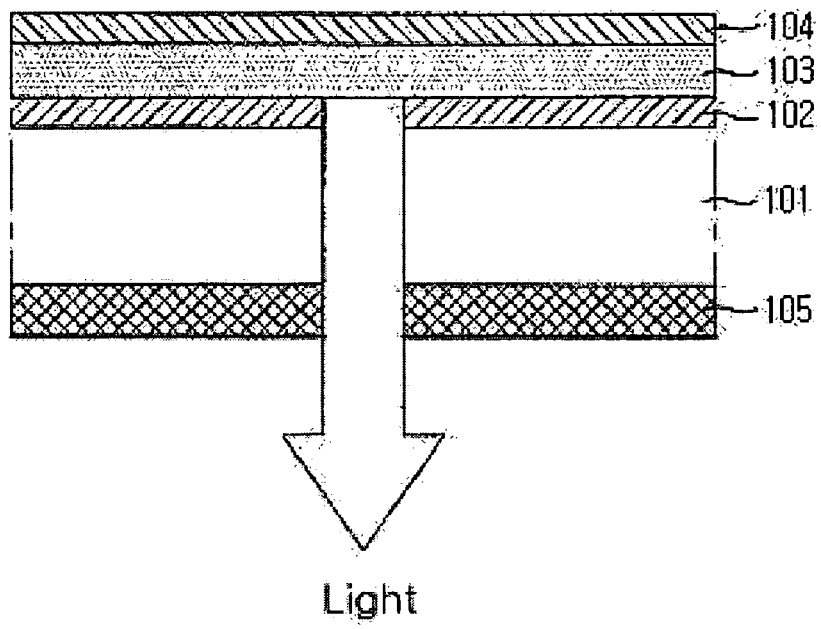
FIG. 1 is a cross-sectional view illustrating the construction of a conventional organic electroluminescent device.
Figure 2:
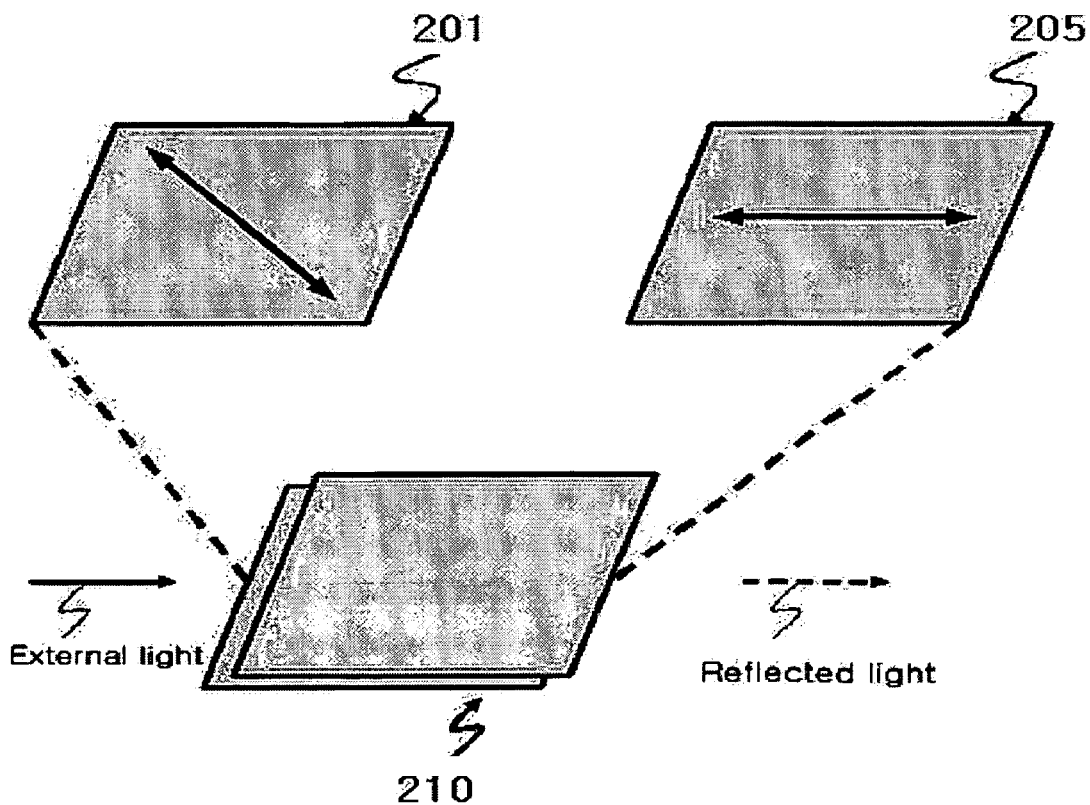
FIG. 2 is a conceptual view for explaining the structure of a conventional circular polarizing filter.

According to an embodiment of the present invention, there is provided an organic electroluminescent device, wherein regions other than the light-emitting regions of a front surface of a panel include a filter on which black matrices for preventing reflection of external light are coated.

The filter includes a conductive thin film made of at least one of copper (Cu), nickel (Ni) and silver (Ag), to block electromagnetic waves.

In the filter, a base film in which the black matrices are formed is one of polyethylene terephthalate (PET), tri acetyl cellulose (TAC), acryl (PMMA) and polyamide (PA).

The filter further includes an ultraviolet (UV) absorbing film.

The filter further includes a color adjustment film.

According to another embodiment of the present invention, there is provided an organic electroluminescent device of various modes, which includes a plurality of pixels each composed of a first electrode, an organic electroluminescent layer and a second electrode, including a black insulator formed on the entire regions other than the pixels, for reducing reflection of externally incident light and providing insulating among the pixels, and an optical filter formed in a direction in which light generated from the electroluminescent layer is outputted toward the outside.

Further, it is preferred that the black insulator is patterned in the form of a strip or matrix, and uses any one of organic material, inorganic material, polymer, inorganic material oxide, and a mixture of the inorganic material and the polymer.

Further, preferably, the black insulator absorbs all light of a visible ray-region, and the optical filter has a transmissivity of 50% in a visible ray region.

Further, the organic electroluminescent device of the various modes is fabricated irrespective of its driving mode and a direction in which light is outputted toward the outside. The driving mode is an active type, and if the direction in which light is outputted toward the outside is a bottom emission type, the black insulator is deposited at the bottom of a semiconductor material of a driving TFT.

The organic electroluminescent device has a driving mode of an active type. If the direction in which light is outputted toward the outside is a bottom emission type, the black insulator is deposited at the top of a semiconductor material of a driving TFT.

The organic electroluminescent device has a driving mode of an active type. If the direction in which light is outputted toward the outside is a bottom emission type, the black insulator and a semiconductor material of a driving TFT are formed in each substrate, and are then connected using a conductive material.

According to still another embodiment of the present invention, there is provided a method of manufacturing an organic electroluminescent device, including the steps of forming a plurality of first electrodes with a given distance therebetween on a transparent substrate, forming a black insulating film on the entire surface other than light-emitting regions of the first electrodes, forming barrier ribs on the black insulating film between the light-emitting regions in a direction vertical to the first electrodes, sequentially forming an organic electroluminescent layer and a second electrode on the entire surface including the barrier ribs, and forming an optical filter in a direction in which light generated from the organic electroluminescent layer is outputted toward the outside.

Preferred embodiments of the present invention will be described in a more detailed manner with reference to the drawings.

Figure 3:
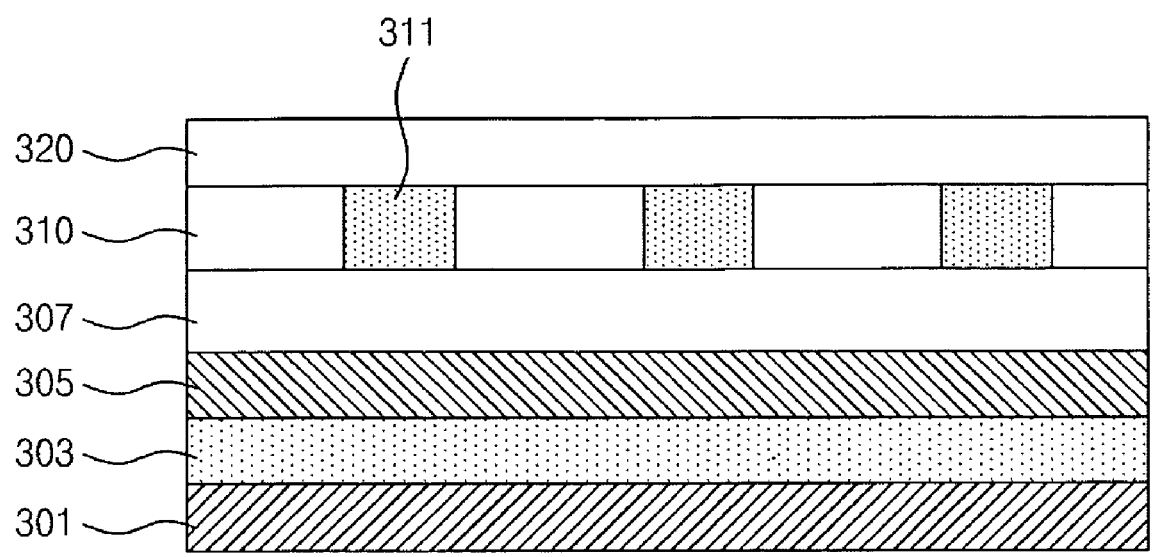
FIG. 3 is a cross-sectional view illustrating the construction of an organic EL panel to which a filter according to a first embodiment of the present invention is applied.

FIG. 3 is a cross-sectional view illustrating the construction of an organic EL panel to which a filter according to a first embodiment of the present invention is applied.

The organic EL panel includes an anode 305 and a cathode 301 with a phosphor layer 303 interposed therebetween.

The anode 305 may be formed as a front electrode layer located in front of the panel that is generally made of indium tin oxide (ITO). ITO is a thin film material used for transparent electrodes, and is coated on the thin film to form a transparent electrode by means of a vacuum deposition method, thereby implementing conductivity. Generally, the transmissivity of the front electrode layer of the anode 305 is 80% or more.

The phosphor layer 303 can consist of a R/G/B phosphor layer or a white phosphor layer depending on its light emission mode. If the phosphor layer 303 is composed of the white phosphor layer, a R/G/B color filter is further formed on the anode 305, thereby properly implementing R/G/B pixels. The color representation mode is a conventional one. Detailed description on it will be thus omitted for simplicity.

A glass substrate 307 is formed on the anode 305, and in particular, on the transparent electrode.

A filter layer 310 according to the present invention is formed on the glass substrate 307. The filter layer 310 of the present invention has black matrices (BM) 311 formed using polyethylene terephthalate (PET), tri acetyl cellulose (TAC) or the like as a base film.

Figure 4A:
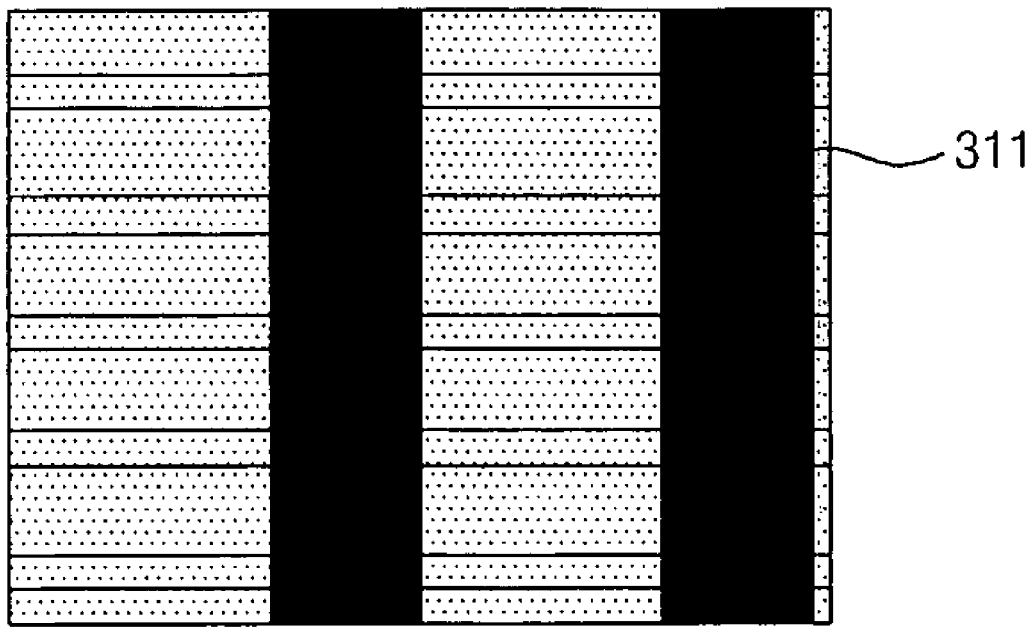
FIGS. 4a and 4b are front views illustrating the construction of an organic EL panel to which the filter according to the first embodiment of the present invention is applied.
Figure 4B:
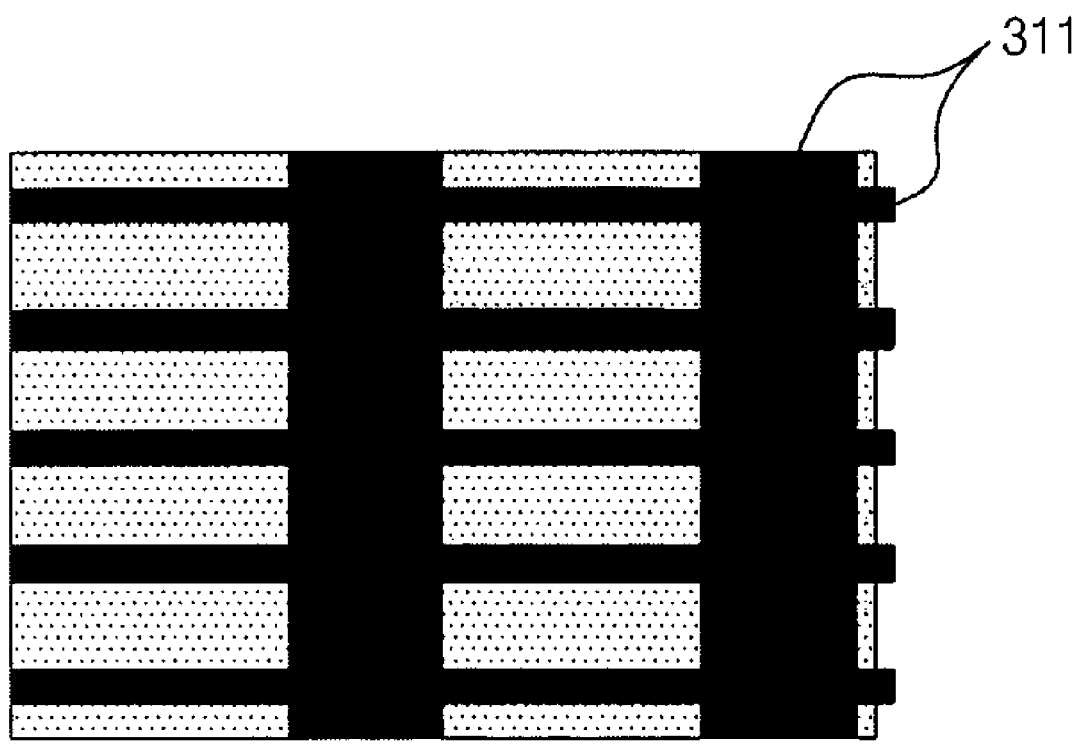

FIGS. 4a and 4b are front views illustrating the construction of an organic EL panel to which the filter according to the first embodiment of the present invention is applied.

The filter layer 310 having the black matrices (BM) 311 will be described in detail with reference to FIGS. 4a and 4b.

FIG. 4a shows a case where the filter layer according to the present invention is applied to an organic EL panel of the active matrix type.

The active matrix type has a thin film transistor (TFT) formed every pixel, as described above. A portion where the TFT is formed corresponds to a portion where reflectance for external light is the highest. Accordingly, the reflectance of external light from the panel can be lowered by coating the TFT portions with BM layers 311 in all areas except for R/G/B phosphor cell portions.

More preferably, as shown in FIG. 4b, the reflectance of external light from the panel can be lowered by coating even portions where an insulating film and barrier ribs, which are formed between transparent electrodes, are formed with the BM layers 311. The material of the organic EL panel is usually transparent, unlike the materials of other display devices. In particular, an organic EL phosphor material is disadvantageous in that it is very weak in moisture, oxygen, etc. Thus, the barrier ribs, electrodes, films, glass, and the like must be made of materials through which moisture or oxygen cannot pass.

Therefore, although barrier ribs are formed, there is a kind of limits unlike other display devices. In view of this, it is required that the whole reflectance and transmissivity be controlled by coating black matrices on a glass upper plate without applying other transformation within a panel in which up to the glass is formed.

If the BM layers 311 are formed as shown in FIG. 4b, about 40% of the whole area of the panel is coated with the BM layers 311. That is, if even portions where the barrier ribs between pixels adjacent to a TFT portion of each pixel are formed are coated with the BM layers 311, the reflectance of the organic EL panel can be reduced below 40%.

Table 1 below shows reflectance and black brightness in a bright room in the case where the conventional circular polarizing filter is applied and where the filter on which the BM layers according to the present invention are coated on is applied.

TABLE 1

|  | Filter (X) | Circular Polarizer Filter | Black Matrix Filter |
|---|---|---|---|
| Reflectance | 80% or more | 30% to 50% | 40% or less |
| Brightness | 14.3 cd/m$^2$ | 1 cd/m$^2$ or less | 6 cd/m$^2$ or less |
| Transmissivity | 90% | Less than 50% | 80% or more |

Table 1 shows a measurement of bright room black brightness of external natural light, which is incident to a panel surface at an angle of 63° at 400 Lux, wherein the black brightness was measured for the organic EL panel of the active matrix type by a measurement equipment PR-650 at a distance 1 m.

From Table 1, it can be seen that the reflectance of the panel itself in which the filter is not used (Filter(X)) is 80% or more, and the reflectance of the panel in which the conventional circular polarizing filter is used is about 30% to 50%. The reflectance of the panel in which the BM filter layer according to the present invention is applied is about 40%, which is similar to that of the conventional circular polarizing filter. In terms of only reflectance, the panel of the present invention has a similar effect as the conventional panel.

Further, from Table 1, it can be seen that the conventional circular polarizing filter has a brightness level of 1 cd/m$^2$ or less, and the BM filter layer of the present invention has a brightness level of 6 cd/m$^2$ or less. These experimental results show that the brightness of the panel of the present invention is almost the same as that of the conventional panel. However, the object of the present invention is to lower reflectance and to improve transmissivity at the same time. Accordingly, it can be seen from Table 1 that the transmissivity of the panel to which the BM filter layer according to the present invention is applied is 80% or more, which is much higher than that of the conventional circular polarizing filter.

Furthermore, in this case, only the BM filter layer is applied and measured. Thus, it was found that if a color adjustment film for improving contrast and chromatic purity, etc. is added, the brightness of the panel can be further improved.

That is, it was found that the brightness was approximately 3 cd/m$^2$ or less when a color adjustment film of 70% Film was applied to a panel having a BM filter layer, and the brightness was approximately 1 to 2 cd/m$^2$ or less when a color adjustment film of 50% Film was applied. Thus, it can be seen that a filter having a color adjustment film provides a high quality filter, the brightness of which is higher than that of the prior art.

Consequently, it was found that in luminous efficiency of the panel, transmissivity was improved, and was about 30% higher than that of the prior art although only the BM filter layer was applied. Further, if the panel includes the color adjustment film for improving the chromatic purity and contrast (in addition to the BM filter layer), it was found that luminous efficiency of 35% or more by maximum was obtained.

The base film of the BM filter layer can polyethylene terephthalate (PET), tri acetyl cellulose (TAC), acryl (PMMA), polyamide (PA), and the like. The black matrix (BM) can be made of a gray color-based material. The materials of the base film and the BM can include those of the conventional display panel. This will be below described in short.

The method of forming the black matrix (BM) can include a conventional plating method, a photolithography method, a patterning method and a printing method.

The BM material can include the following materials.

(1) It can be formed by blackening a material such as Cu through an electroplating method.

Blackening may employ alloys of CuO and CuO$_2$ being Cu oxide, or Al, Ni, Co, etc., or surface plating of Ni, Co, Al, Zn, etc.

(2) Zn oxide, Al oxide, Fe oxide or Co oxide (3) Organic material, more particularly, a photoresist material for allowing a pattern mode, an emulsion material that can be used as a photomask (4) Organic dyes or inorganic dyes through a printing method.

Further, preferably, the BM filter layer can be made of a conductive material such as Ag or Cu so that it can serve as an electromagnetic wave blocking film. Specific detrimental effects of such electromagnetic waves have not been reported so far. It is, however, possible to fabricate safer and environment-friendly products by also providing an electromagnetic wave blocking function.

Moreover, since the BM filter layer of the organic EL display panel is formed through conventional technologies, description on material properties of BM and a method of forming the BM will be omitted.

Referring again to FIG. 3, an ultraviolet (UV) absorbing layer 320 can be further formed on the BM filter layer 310 described with reference to FIG. 4.

The UV absorbing layer 320 serves to reduce loss of emission brightness of the organic electroluminescent device and to prevent damage of the device from UV. In addition, the UV absorbing layer 320 can be constructed by adding a functional film for improving color adjustment and contrast.

Figure 5:
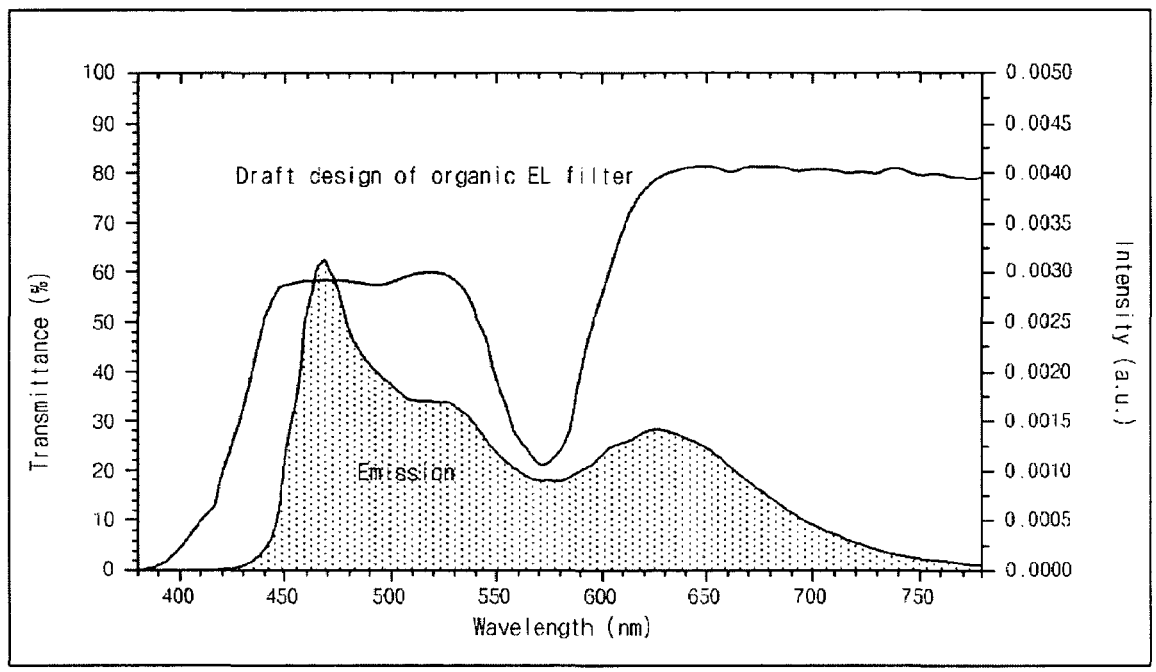
FIG. 5 is a graph for designing the filter according to the first embodiment of the present invention the filter based on the amount of emission light through spectrum analysis of the panel.

FIG. 5 is a graph for designing the filter according to the first embodiment of the present invention based on the amount of emission light through spectrum analysis of the panel.

In FIG. 5, there is shown a graph for designing a filter based on measured emission of an organic EL display panel in order to design a film filter having improved color adjustment and contrast.

A curve under the graph is a spectrum curve of light emitted from the panel. Usually, a band of 400 nm shows blue, a band of 520 to 530 nm shows green, and a band of 620 nm shows red.

A visible ray band having the lowest amount of emission is a region corresponding to orange and yellow, which ranges from 560 nm to 590 nm. A curve over the emission curve is a draft for designing an organic EL filter according to the present invention on the basis of panel emission as such. The filter is designed so that the UV region is blocked. It can be seen that in the visible ray region, the filter is designed by sharply blocking a wavelength region corresponding to orange and yellow.

Figure 6:
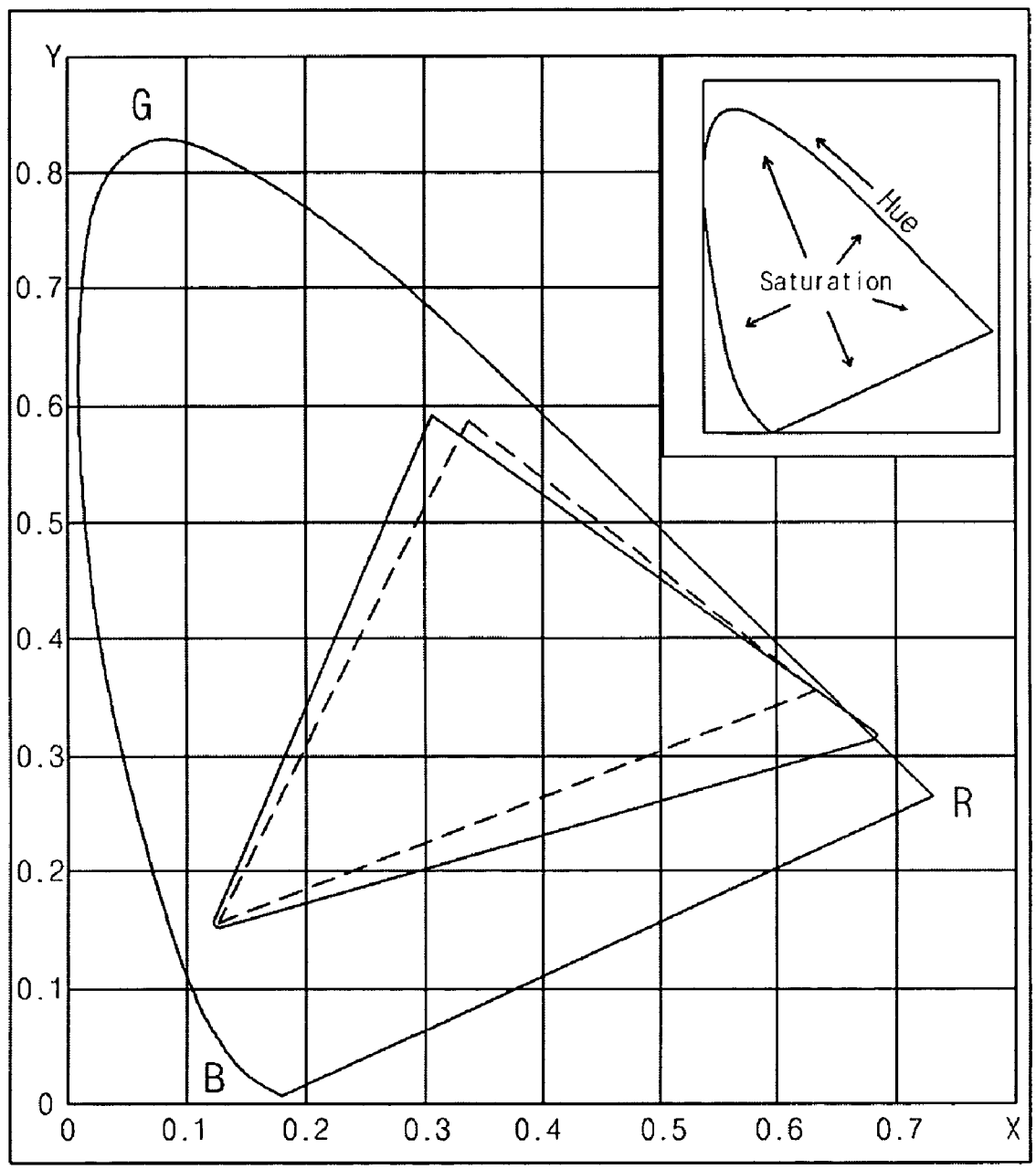
FIG. 6 is a graph showing a color coordinate shift characteristic.

R/G/B color coordinate shift characteristics of the organic EL display panel when the filter designed as above is used will now be compared with those of the prior art with reference to FIG. 6.

FIG. 6 is a graph showing the color coordinate shift characteristics.

A common organic EL panel has a characteristic in that chromatic purity is relatively lowered. In the graph of FIG. 6, a dotted triangle indicates a color coordinate shift of the panel itself, and a solid line triangle indicates a color coordinate shift when the filter according to the present invention is used.

From FIG. 6, it can be seen that if the filter according to the present invention is used, the area of the triangle, which corresponds to a range of the color coordinate shift, is very wide. This means that a color representation range becomes wide by using the filter. Table 2 below shows R/G/B color coordinates when the filter of the present invention is used.

TABLE 2

|   | X Coordinate | Y Coordinate |
|---|---|---|
| R | 0.641 | 0.351 |
| G | 0.302 | 0.626 |
| B | 0.128 | 0.181 |

Figure 7A:
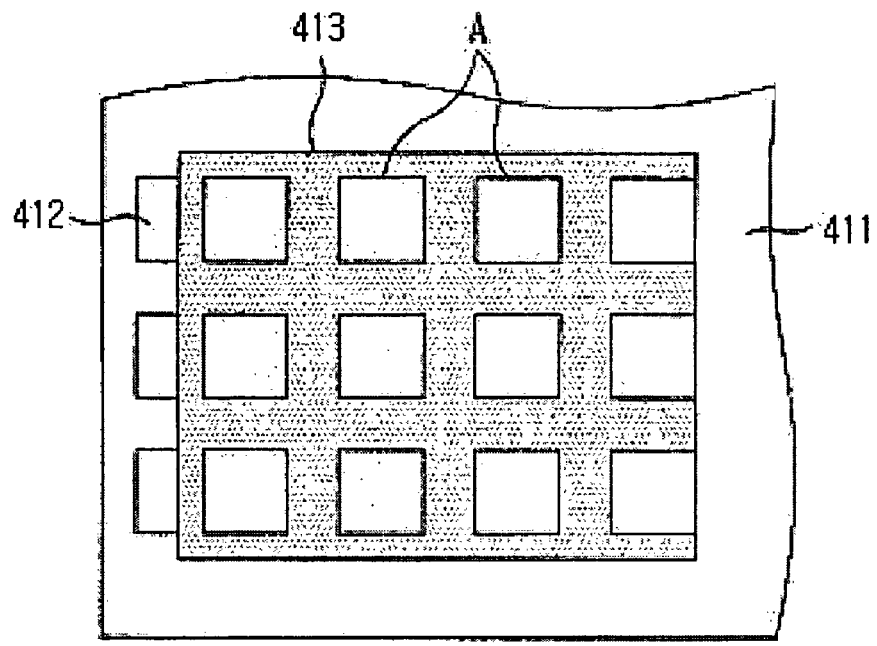
FIGS. 7a to 7c are views illustrating the construction of an organic electroluminescent device according to a second embodiment of the present invention.
Figure 7B:
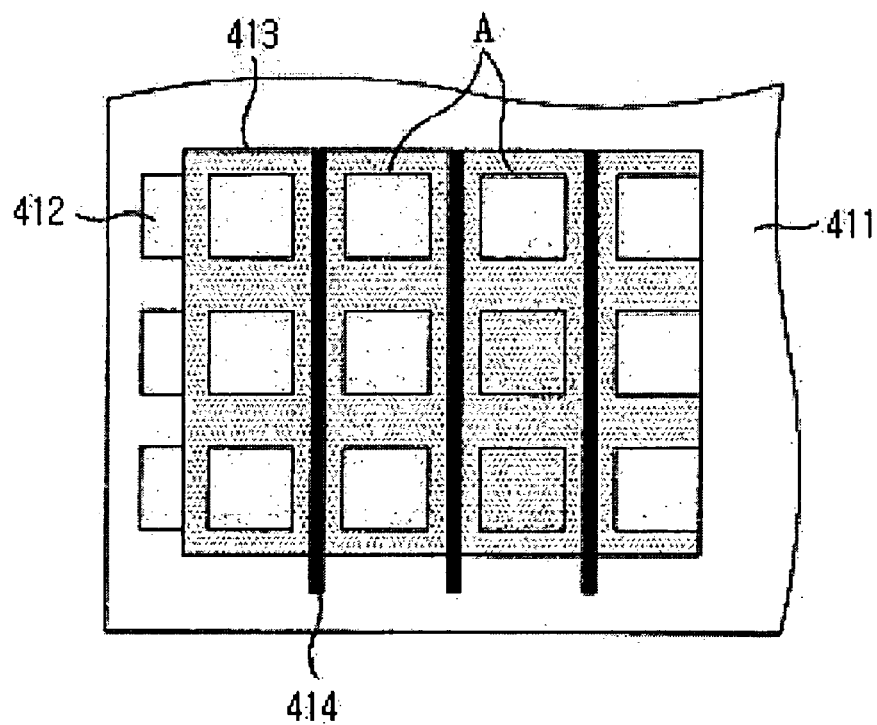
Figure 7C:
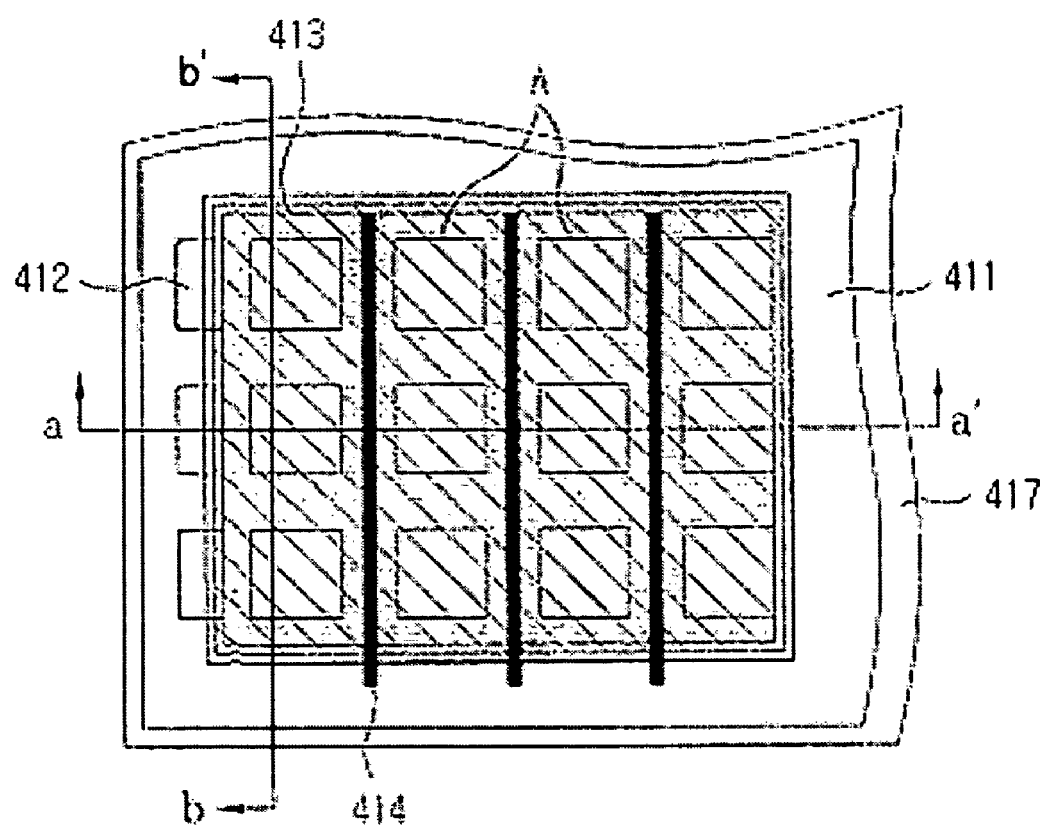

FIGS. 7a to 7c are views illustrating the construction of an organic electroluminescent device according to a second embodiment of the present invention.

The organic electroluminescent device of a passive type according to the second embodiment of the present invention will be below described with reference to FIGS. 7a to 7c.

Referring first to FIG. 7a, a plurality of anodes 412 made of ITO (Indium Tin Oxide) is formed on a transparent substrate 411 with a given distance therebetween. A black insulating film 413 for providing insulation among pixels is then formed on the entire surface other than pixel portions A, which will become light-emitting regions.

In this time, preferably, the black insulating film 413 covers portions except for the light-emitting regions (pixel portions A), and can be patterned in the form of a stripe or matrix.

Further, the black insulating film 413 can be made of any one of organic material, inorganic material, polymer, inorganic material oxide, and a mixture of the materials. The color of the black insulating film 413 absorbs all light emitted from the visible ray region, and has a sufficient insulation characteristic to provide insulation among the pixels.

Referring next to FIG. 7b, barrier ribs 414 are formed on the black insulator 413 between the pixel portions A in a direction vertical, or perpendicular, to the anodes 412.

Figure 8A:
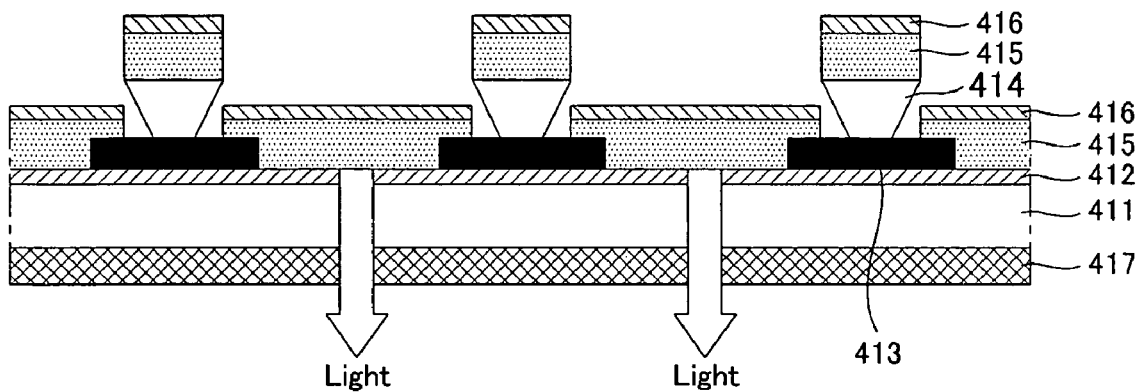
FIG. 8a is a cross-sectional view illustrating the construction of the organic electroluminescent device taken along line a-a' in FIG. 7c.
Figure 8B:
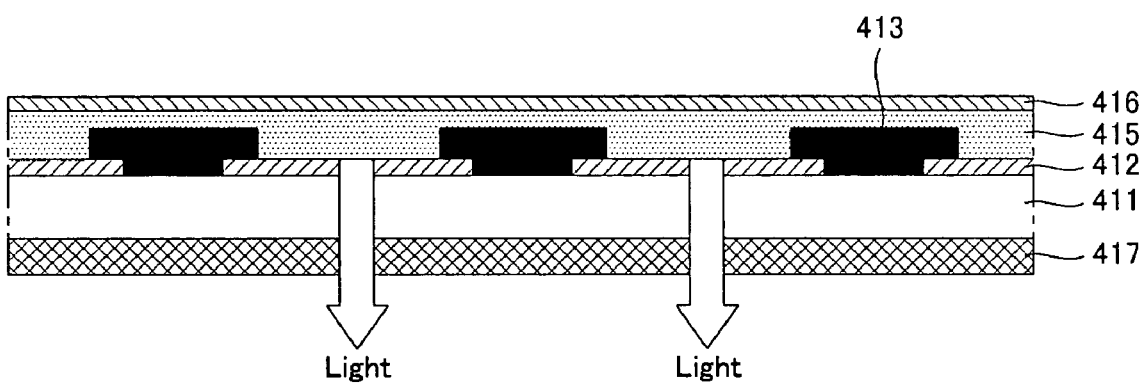
FIG. 8b is a cross-sectional view illustrating the construction of the organic electroluminescent device taken along line b-b' in FIG. 7c.

Referring to the cross sections shown in FIGS. 8a and 8b, taken along lines a-a$^1$ and b$^1$-b$^1$, respectively, FIG. 7c, an organic EL layer 415 and a cathode 416 are sequentially formed on the entire surface including the barrier ribs 414.

In this time, the organic EL layer 415 and the cathode 416 of each pixel (A) are electrically insulated by the black insulator 413 between the respective pixels (A) and the barrier ribs 414 formed thereon.

An optical filter 417 is formed in a direction in which light generated from the EL layer 415 of the organic electroluminescent device formed as above is outputted toward the outside.

The optical filter 417 has a constant transmissivity (50% or more) in the visible ray region. In this time, the transmissivity is controlled according to a wavelength, thus adjusting color coordinate and a color representation rate.

Further, the optical filter 417 can be formed in a film shape, and can be directly coated or deposited on the substrate.

The material of the optical filter 417 can be any one of organic material, inorganic material, polymer, inorganic material oxide, and a mixture of the materials. The optical filter 417 can have a visible ray transmissivity of 50% or more.

FIG. 8a is a cross-sectional view illustrating the construction of the organic electroluminescent device taken along line a-a' in FIG. 7c. FIG. 8b is a cross-sectional view illustrating the construction of the organic electroluminescent device taken along line b-b' in FIG. 7c. The positions of the organic EL layer 415 and the cathode 416, which are not shown in FIG. 7c, can be seen from FIGS. 8a and 8b.

Figure 9:
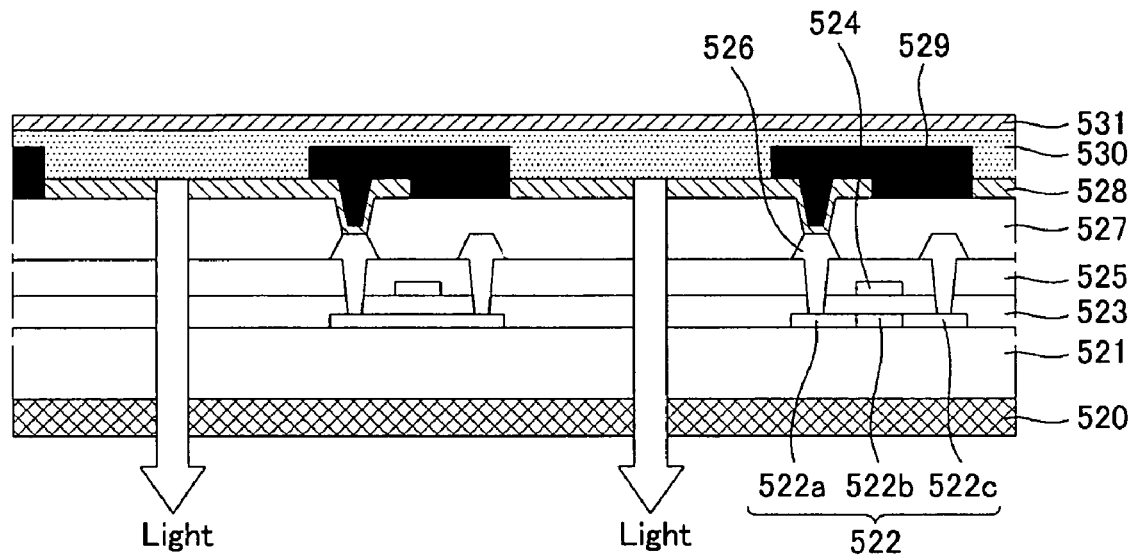
FIG. 9 is a view illustrating the construction of an organic electroluminescent device according to a third embodiment of the present invention.

FIG. 9 is a view illustrating the construction of an organic electroluminescent device according to a third embodiment of the present invention.

The construction of the organic electroluminescent device according to this embodiment will now be described with reference to FIG. 9. It is to be noted that the organic electroluminescent device according to this embodiment has the same basic construction as that of the second embodiment except that it is an active type organic electroluminescent device.

First, a semiconductor layer 522 such as polysilicon, which will be used as an active layer of a thin film transistor, is formed on a transparent substrate 521, and is then patterned.

A gate insulating film 523 is formed. Next, a gate electrode 524 is deposited and is then patterned.

Then, an impurity such as boron (B) or phosphor (P) is injected into portions of the semiconductor layer 522, and is then annealed to form a source-drain region 522a-522c of the thin film transistor.

An interlayer insulating film 525 is deposited on the gate electrode 524. Portions of the gate insulating film 523 and the interlayer insulating film 525 on the source-drain region 522a-522c of the thin film transistor are then etched to form contact holes. Thereafter, electrode lines 526 are formed in the contact holes.

The contact holes extend to the source-drain region 522a-522c of the thin film transistor of the semiconductor layer 522. Metal electrodes are formed on the contact holes at a region where a capacitor is formed.

Thereafter, an insulating film 527 is formed on the electrode lines 526. A portion of the insulating film 527 of the source region is etched, and a transparent conductive material such as ITO and IZO is then deposited on the exposed surface as an anode electrode 528. Next, a black insulating film 529 is formed to cover some of the anode electrode 528. Thereafter, an organic light-emitting layer 530 and a cathode electrode 531 are sequentially formed on the black insulating film 529.

In this time, it is preferred that the black insulating film 529 covers the portions other than the light-emitting regions. The black insulating film 529 can be patterned in the form of a stripe or matrix.

Furthermore, the black insulating film 529 can be made of any one of organic material, inorganic material, polymer, inorganic material oxide, and a mixture of the materials. The color of the black insulating film 529 absorbs all light emitted from the visible ray region, and has a sufficient insulation characteristic to provide insulation among pixels.

Next, an optical filter 520 is formed in a direction in which light generated from the light-emitting layer 530 of the organic electroluminescent device formed as above is outputted toward the outside. In the third embodiment, the optical filter 520 has a bottom emission type.

The optical filter 520 has a constant transmissivity (50% or more) in the visible ray region.

In this time, the transmissivity is controlled according to a wavelength, thus adjusting color coordinate and a color representation rate.

Further, the optical filter 520 can be formed in the form of a film, and can be directly coated or deposited on the substrate.

The material of the optical filter 520 can be any one of organic material, inorganic material, polymer, inorganic material oxide, and a mixture of the materials, and it can have a visible ray transmissivity of 50% or more.

Figure 10:
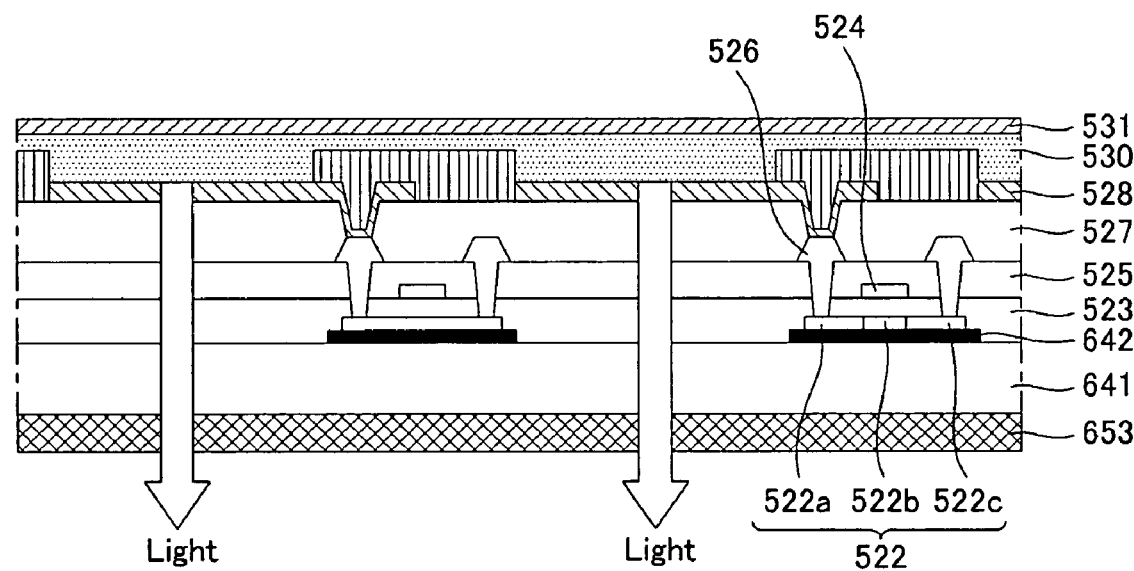
FIG. 10 is a view illustrating the construction of an organic electroluminescent device according to a fourth embodiment of the present invention.

FIG. 10 is a view illustrating the construction of an organic electroluminescent device according to a fourth embodiment of the present invention.

The construction of FIG. 10 is the same as that of FIG. 9 except that a black insulating film 642 is deposited before a semiconductor material is formed on a substrate 641.

As described above, the black insulating film 642 and an optical filter 653 are applied to the organic electroluminescent device having the bottom emission type of an active type driving mode. It is thus possible to improve the picture quality of the display device and to prevent degradation of a driving TFT due to external light and internal light.

Figure 11:
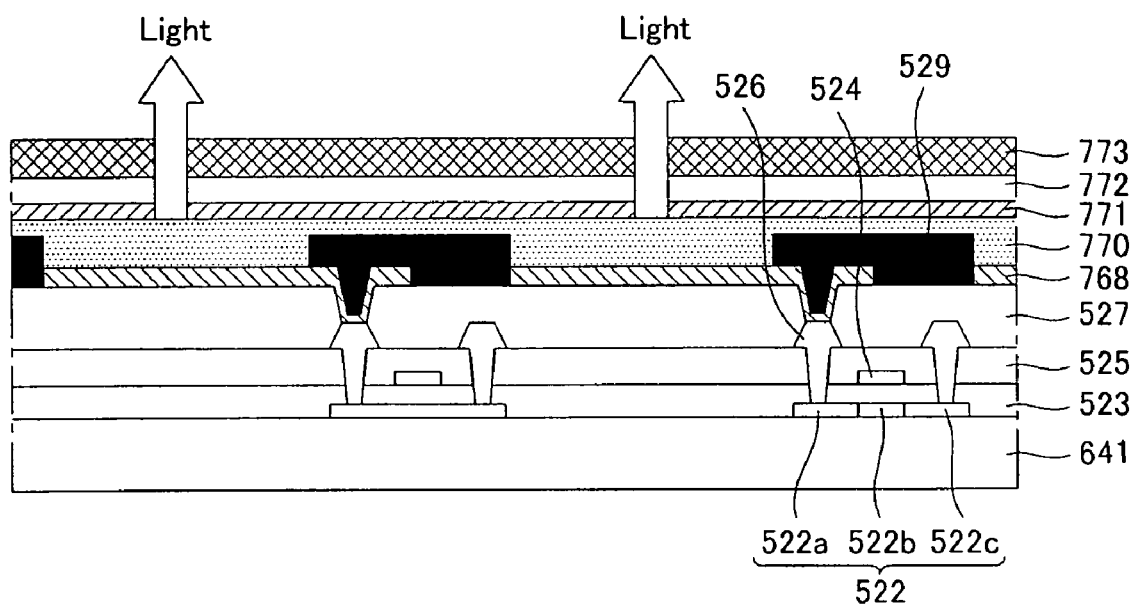
FIG. 11 is a view illustrating the construction of an organic electroluminescent device according to a fifth embodiment of the present invention.

FIG. 11 is a view illustrating the construction of an organic electroluminescent device according to a fifth embodiment of the present invention.

The construction of FIG. 11 is the same as that of FIG. 9 except that an anode 768 uses a metal electrode not the transparent electrode, and it has a top emission type in which a cathode electrode 771 is made transparent so that light generated from a light-emitting layer 770 of the organic electroluminescent device is outputted toward the cathode electrode 771.

If the cathode electrode 771 is formed, a passivation layer or a sealing cap 772 for protecting the organic film 770 of the organic electroluminescent device is formed, and an optical filter 773 is then formed.

Meanwhile, the optical filter 773 is formed so that it itself has a barrier characteristic against moisture, oxygen, etc., and it can be thus used as a passivation layer.

Figure 12:
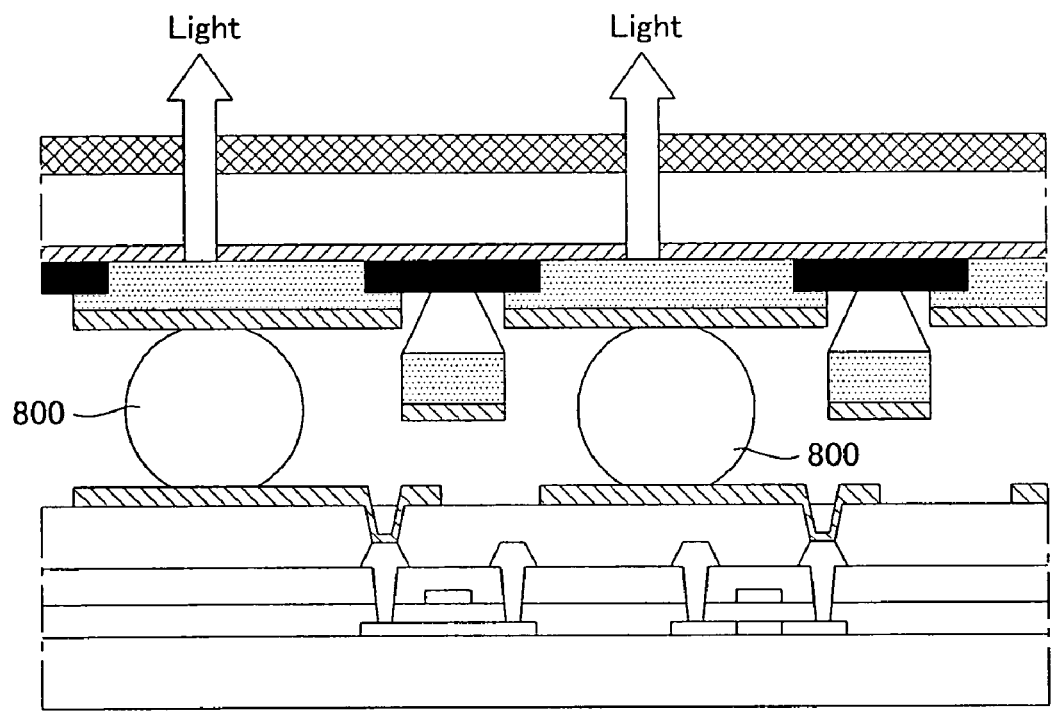
FIG. 12 is a view illustrating the construction of an organic electroluminescent device according to a sixth embodiment of the present invention.

FIG. 12 is a view illustrating the construction of an organic electroluminescent device according to a sixth embodiment of the present invention.

The construction of FIG. 12 is the same as that of FIG. 9 except that a TFT driving unit for driving the organic El device and an organic EL layer are formed in each substrate, and are then connected using a conductive material 800.

As described above, the present invention are advantageous in that it can further improve not only reflectance but also transmissivity, and can provide a high quality filter with improved luminous efficiency. Furthermore, a black insulating film and an optical filter are used in an organic EL device at the same time. Accordingly, the present invention has effects in that it can significantly improve the brightness without significant reduction in contrast and can improve the picture quality of an organic EL device.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. An organic electroluminescent device including a plurality of pixels each having a first electrode, an organic electroluminescent layer and a second electrode, the device further comprising:
    a black insulator provided at regions between adjacent pixels, wherein the black insulator reduces reflection of externally incident light and provides insulation between adjacent pixels, and
    an optical filter oriented in a direction such that light generated by the electroluminescent layer is directed to an outside of the device,
    wherein the black insulator is directly formed on a semiconductor material of a driving thin film transistor.

2. The organic electroluminescent device as claimed in claim 1, wherein the black insulator is patterned in the form of a strip or matrix.

3. The organic electroluminescent device as claimed in claim 1, wherein the black insulator includes an organic material, an inorganic material, an inorganic material oxide, or a mixture of an inorganic material and a polymer.

4. The organic electroluminescent device as claimed in claim 1, wherein the black insulator absorbs substantially all light of a visible ray region.

5. The organic electroluminescent device as claimed in claim 1, wherein the optical filter has a transmissivity of approximately 50% in a visible ray region.

* * * * *